United States Patent
Shin

(10) Patent No.: US 6,646,483 B2
(45) Date of Patent: Nov. 11, 2003

(54) OUTPUT BUFFER CIRCUIT FOR REDUCING VARIATION OF SLEW RATE DUE TO VARIATION OF PVT AND LOAD CAPACITANCE OF OUTPUT TERMINAL, AND SEMICONDUCTOR DEVICE INCLUDING THE SAME

(75) Inventor: Soon-kyun Shin, Swongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/229,976

(22) Filed: Aug. 28, 2002

(65) Prior Publication Data

US 2003/0042953 A1 Mar. 6, 2003

(30) Foreign Application Priority Data

Aug. 31, 2001 (KR) ......................................... 2001-53271

(51) Int. Cl.$^7$ ................................................ H03K 3/00
(52) U.S. Cl. ...................................... 327/112; 327/170
(58) Field of Search ................................ 327/379, 380,
327/108, 112, 170, 156; 326/27, 58, 87, 83

(56) References Cited

U.S. PATENT DOCUMENTS 5,877,647 A * 3/1999 Vajapey et al. ............. 327/391
6,177,817 B1 * 1/2001 Fifield et al. ................ 327/380
6,420,924 B1 * 7/2002 Lundberg .................... 327/333
6,466,063 B2 * 10/2002 Chen ............................ 327/83

FOREIGN PATENT DOCUMENTS

EP          0952668     * 10/1999

* cited by examiner

Primary Examiner—Dinh Lee
(74) Attorney, Agent, or Firm—Mills & Onello, LLP

(57) ABSTRACT

An output buffer circuit for reducing a variation of the slew rate due to a variation of process, voltage and temperature (PVT) and the load capacitance of an output terminal, and semiconductor device including the same, include a first slew rate control circuit for pulling down the voltage of a pull-up signal in multiple stages in response to a first control signal, and a second slew rate control circuit for pulling up the voltage of a pull-down signal in multiple stages in response to a second control signal. A pull-up driver is provided for pulling up an output terminal in response to the pull-up signal, and a pull-down driver is provided for pulling down the output terminal in response to the pull-down signal. The first and second slew rate control circuits are controlled by bias voltages that are provided by a phase locked loop circuit and compensate for changes in PVT.

14 Claims, 5 Drawing Sheets

OUTPUT BUFFER CIRCUIT FOR REDUCING VARIATION OF SLEW RATE DUE TO VARIATION OF PVT AND LOAD CAPACITANCE OF OUTPUT TERMINAL, AND SEMICONDUCTOR DEVICE INCLUDING THE SAME

BACKGROUND OF THE INVENTION

1. Field of the Invention

The present invention relates to a semiconductor device, and more particularly, to an output buffer circuit for a semiconductor device.

2. Description of the Related Art

An output buffer circuit in a semiconductor device is used to output internal data through an output terminal or output pad. As shown in FIG. 1, a contemporary output buffer circuit typically includes: an output driver 11 including a pull-up PMOS transistor P11 and a pull-down NMOS transistor N11; an inverter 13 for inverting data to be output, for feeding the inverted data to the gate of the pull-up PMOS transistor P11, and for adjusting the pull-up slew rate of the output driver 11; and an inverter 15 for inverting the output data, for feeding the inverted data to the gate of the pull-down NMOS transistor N11, and for adjusting the pull-down slew rate of the output driver 11.

In the contemporary output buffer circuit as shown in FIG. 1, the slew rate of the output driver 11 is determined by the current that charges the load capacitance C of the output terminal 17 through the pull-up PMOS transistor P11, and the current that is discharged from the load capacitance C of the output terminal 17 through the pull-down NMOS transistor N11. Here, the current varies drastically with process, voltage and temperature (hereinafter referred to as PVT) and the slew rate of the output driver 11 varies drastically with the change of the PVT.

The slew rate of the output driver 11 also varies with the load capacitance C of the output terminal 17. For example, if the load capacitance of the output terminal 17 doubles, the slew rate will change proportionally.

Therefore, the disadvantage of the contemporary output buffer circuit shown in FIG. 1 is that it cannot meet tight slew rate specifications if the PVT and the load capacitance of the output terminal 17 change.

SUMMARY OF THE INVENTION

To address the above-described problems, it is an object of the present invention to provide an output buffer circuit that reduces the slew rate variation caused by the change of PVT (process, voltage and temperature) and load capacitance of an output terminal.

Another objective of the present invention is to provide a semiconductor device containing an output buffer circuit that reduces the slew rate variation caused by the change of PVT and load capacitance of the output terminal.

To address the above-described limitations, an output buffer circuit according to the present invention includes: a pull-up driver for pulling up an output terminal in response to a pull-up signal; a pull-down driver for pulling down the output terminal in response to a pull-down signal; a first slew rate control circuit for pulling down the voltage of the pull-up signal in multiple stages in response to a first control signal; and a second slew rate control circuit for pulling up the voltage of the pull-down signal in multiple stages in response to a second control signal.

Preferably, the first slew rate control circuit includes: a first delay circuit for delaying the first control signal in response to a first bias voltage and a second bias voltage; and a first control circuit for pulling down the pull-up signal in response to the first control signal and the second bias voltage in a first stage, and again pulling down the pull-up signal in response to the first control signal and the output signal of the first delay circuit in a second stage.

Preferably, the second slew rate control circuit includes: a second delay circuit for delaying the second control signal in response to the first bias voltage and the second bias voltage; and a second control circuit for pulling up the pull-down signal in response to the second control signal and the first bias voltage in the first stage, and again pulling up the pull-down signal in response to the second control signal and the output signal of the second delay circuit in the second stage.

Preferably, the first bias voltage and the second bias voltage are provided by a phase locked loop (PLL) circuit.

To achieve another objective, the semiconductor device according to the present invention includes: a PLL circuit including a voltage controlled oscillator that outputs a first bias voltage and a second bias voltage; a slew rate control circuit controlled by the first bias voltage and the second bias voltage, for pulling down the voltage of a pull-up signal in multiple stages in response to a first control signal, and pulling up the voltage of a pull-down signal in multiple stages in response to a second control signal; and an output driver for pulling up an output pad terminal in response to the pull-up signal and pulling down the output pad terminal in response to the pull-down signal.

The slew rate control circuit includes: a first slew rate control circuit controlled by the first bias voltage and the second bias voltage, for pulling down the voltage of the pull-up signal in multiple stages in response to the first control signal; and a second slew rate control circuit controlled by the first bias voltage and the second bias voltage, for pulling up the voltage of the pull-down signal in multiple stages in response to the second control signal.

Preferably, the first slew rate control circuit includes: a first delay circuit for delaying the first control signal in response to the first bias voltage and the second bias voltage; and a first control circuit for pulling down the pull-up signal in response to the first control signal and the second bias voltage in a first stage, and again pulling down the pull-up signal in response to the first control signal and the output signal of the first delay circuit in a second stage.

Preferably, the second slew rate control circuit includes: a second delay circuit for delaying the second control signal in response to the first bias voltage and the second bias voltage; and a second control circuit for pulling up the pull-down signal in response to the second control signal and the first bias voltage in the first stage, while again pulling up the pull-down signal in response to the second control signal and the output signal of the second delay circuit in the second stage.

Preferably, the first delay circuit and the second delay circuit comprise unit delays that are substantially similar to unit delays of the voltage controlled oscillator of the PLL.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF PREFERRED EMBODIMENTS

The above object and advantages of the present invention will become more apparent by describing in detail the configuration and operation of preferred embodiments thereof with reference to the attached drawings. Like reference symbols refer to like elements throughout the drawings.

Figure 1:
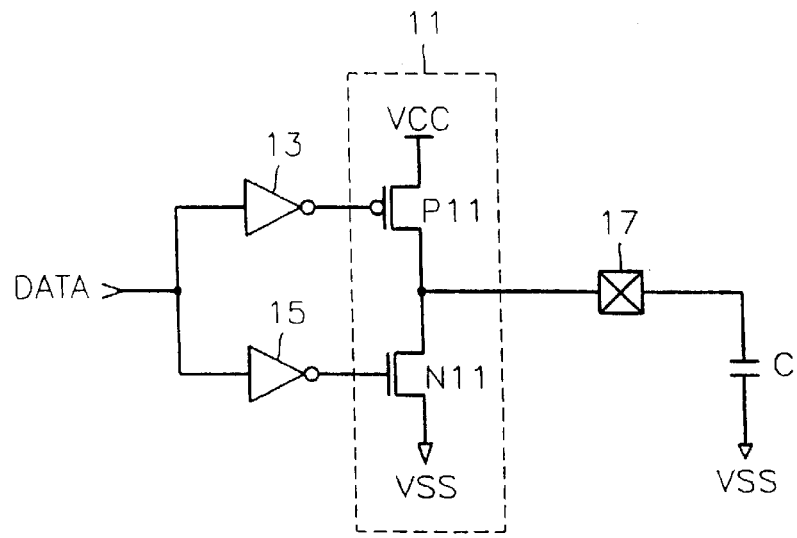
FIG. 1 is a circuit diagram showing a typical contemporary output buffer circuit.
Figure 2:
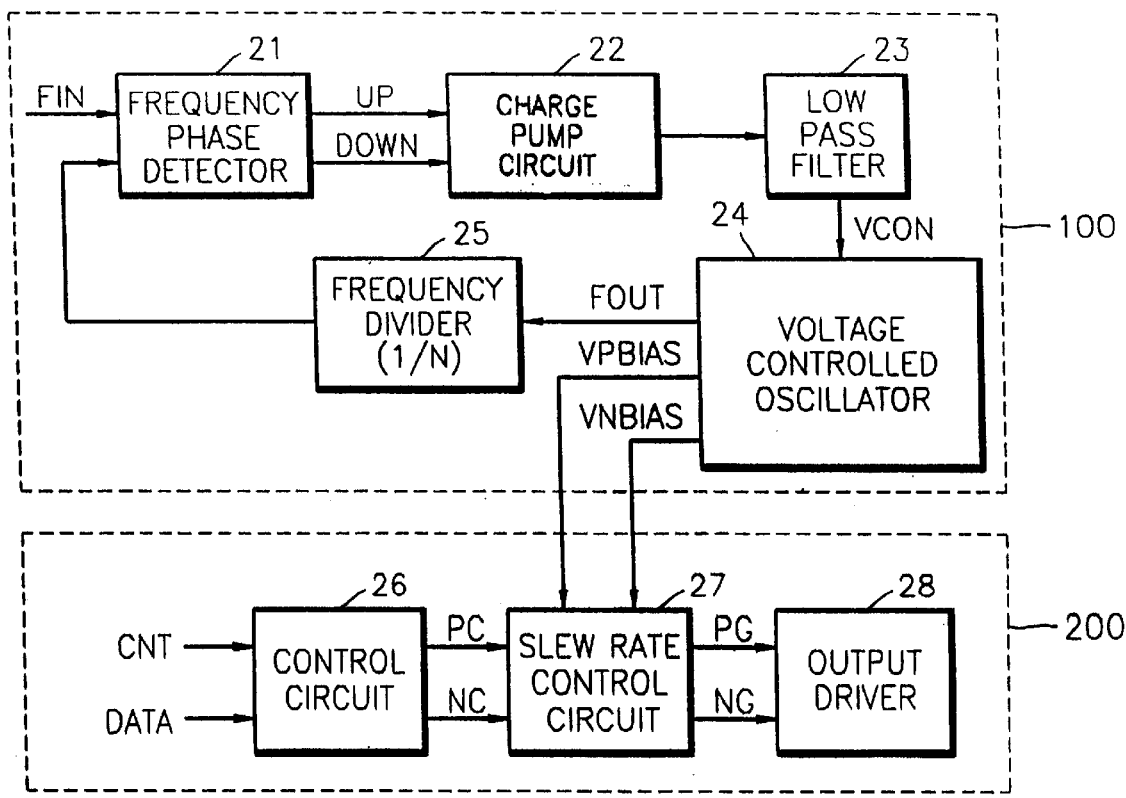
FIG. 2 is a block diagram illustrating a semiconductor device according to the present invention.

FIG. 2 is a block diagram illustrating a semiconductor device according to the present invention.

As shown in FIG. 2, the semiconductor device according to the present invention includes a PLL circuit 100 and an output buffer circuit 200 controlled by the PLL circuit 100.

The PLL circuit 100 includes a phase detector 21, a charge pump circuit 22, a low pass filter 23, a voltage controlled oscillator 24 and a frequency detector 25.

During operation, the PLL circuit 100 receives a system clock signal FIN that is typically generated by an external crystal oscillator and operates in a locked state after a certain period of time, even though the PVT may change. When the PLL circuit 100 is locked, the frequency of the signal (Fout) output from the voltage controlled oscillator 24 becomes regular, irrespective of variance in PVT. In particular, the voltage controlled oscillator 24 generates a first bias voltage (VPBIAS) and a second bias voltage (VNBIAS) to compensate for the PVT change, and provides the first and second bias voltages to the output buffer circuit 200.

The output buffer circuit 200 includes a control circuit 26, a slew rate control circuit 27 and an output driver 28. The control circuit 26 receives the output data in response to the output control signal (CNT) and data signal (DATA), and, in response, generates a first control signal (PC) and a second control signal (NC). The DATA signal represents a signal to be output at pad 29 (see FIG. 4), and the CNT signal is a tri-state control signal. In other words, when the CNT signal is logic 0, the DATA signal is output by the output terminal pad 29. When the CNT signal is logic 1, the output terminal pad 29 is placed in a tri-state mode. For example, when the DATA signal is logic 1 and the CNT signal is logic 0, the PC and NC signals are both logic 1. When the DATA and CNT signals are both logic 0, the PC and NC signals are both logic 0. When the DATA signal is logic 0 and the CNT signal is logic 1, the PC signal is logic 0 and the NC signal is logic 1 (tri-state mode).

The slew rate control circuit 27 is controlled in response to the first bias voltage and the second bias voltage (VPBIAS, VNBIAS), and pulls down the voltage of a pull-up signal (PG) in multiple stages in response to the first control signal (PC), and pulls up the voltage of the pull-down signal (NG) in multiple stages in response to the second control signal (NC).

The output driver 28 pulls up the output terminal 29 in response to the pull-up signal (PG) that is pulled down in multiple stages, and pulls down the output terminal 29 in response to the pull-down signal (NG) that is pulled up in multiple stages.

Therefore, in the semiconductor device according to the present invention, since the output buffer circuit 200 is controlled by the first bias voltage and the second bias voltage (VPBIAS, VNBIAS) that compensate for the PVT change, the slew rate change of the output buffer circuit 200 is small, even when the PVT changes. In addition, because the pull-up signal (PG) and the pull-down signal (NG) that control the output driver 28 are pulled down or pulled up in multiple stages, the slew rate change of the output buffer circuit 200 is small even when the load capacitance of the output terminal changes drastically. The slew rate control circuit 27, and the configuration and the structure of the output driver 28, will be described in detail below with reference to FIG. 4.

Figure 3:
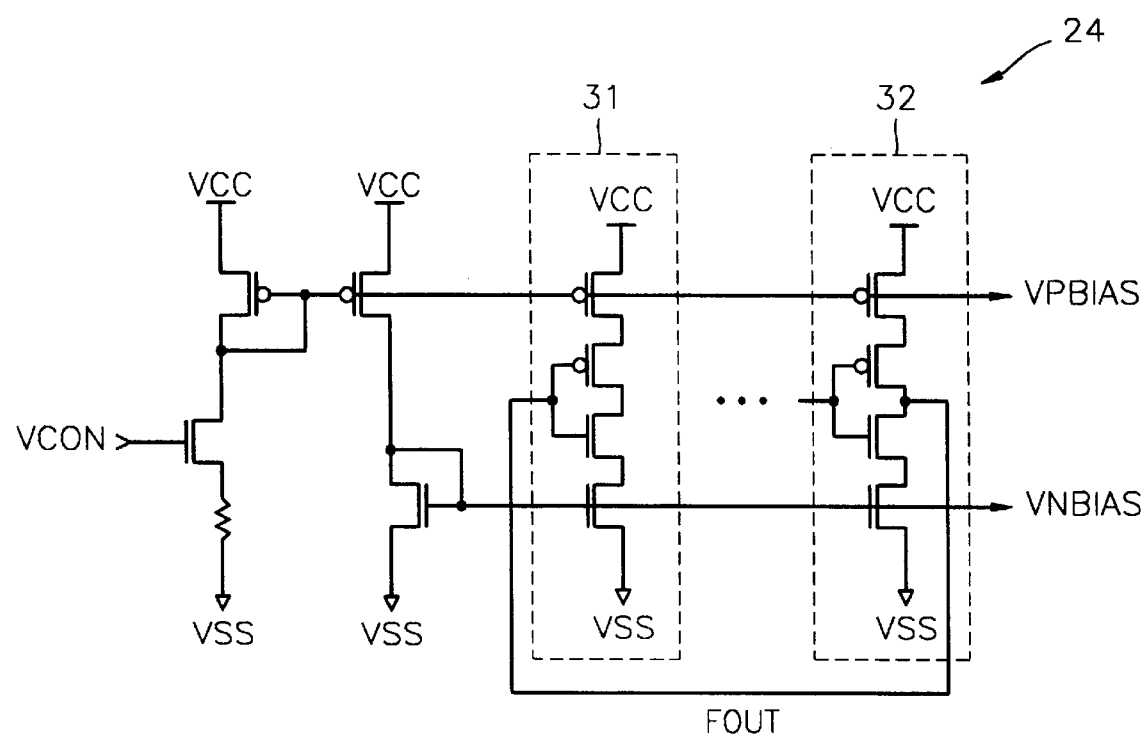
FIG. 3 is a circuit diagram illustrating a voltage controlled oscillator for the semiconductor device of FIG. 2, in accordance with the present invention.

FIG. 3 is a circuit diagram illustrating an embodiment of the voltage controlled oscillator 24 shown in FIG. 2.

As shown in FIG. 3, the voltage controlled oscillator 24 may be of a starved current type that includes multiple unit delays 31 . . . 32, and outputs the first bias voltage and the second bias voltage (VPBIAS, VNBIAS) that compensate for the PVT change. The first bias voltage and the second bias voltage (VPBIAS, VNBIAS) are determined by the control voltage (VCON) output by the low pass filter 23 shown in FIG. 2. FOUT is determined according to the voltage levels of the VPBIAS and VNBIAS signals, the sizes of the transistors in the delays 31, 32 and the number of delays 31, 32.

When the PLL circuit 100 becomes locked, the frequency of the signal (Fout) output from the voltage controlled oscillator 24 maintains a regular state irrespective of changes in process, voltage or temperature (PVT). Multiple unit delays 31 and 32 in the voltage controlled oscillator 24 have a regular delay time.

Figure 4:
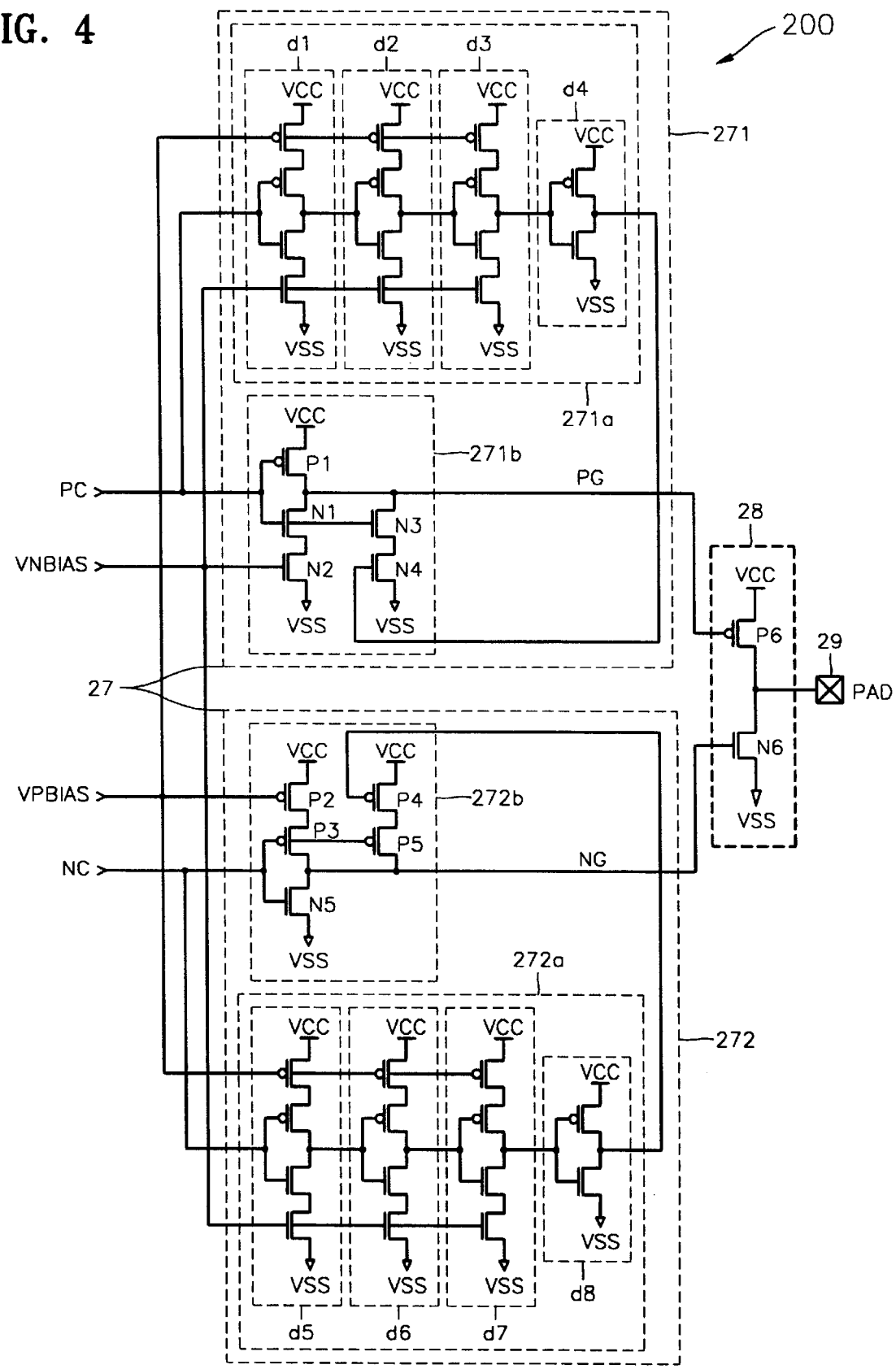
FIG. 4 is a detailed circuit diagram of the output buffer circuit of FIG. 2 in accordance with the present invention.

FIG. 4 is a circuit diagram illustrating an embodiment of the output buffer circuit 200 of FIG. 2 in detail according to the present invention.

As shown in FIG. 4, the slew rate control circuit 27 of FIG. 2 includes a first slew rate control circuit 271 and a second slew rate control circuit 272. The first slew rate control circuit 271 is controlled by the first bias voltage and the second bias voltage (VPBIAS, VNBIAS) and pulls down the voltage of the pull-up signal (PG) in multiple stages in response to the first control signal (PC). The second slew rate control circuit 272 is controlled by the first bias voltage and the second bias voltage (VPBIAS, VNBIAS) and pulls up the voltage of the pull-down signal (NG) in multiple stages in response to the second control signal (NC).

In further detail, the first slew rate control circuit 271 includes a first delay circuit 271a and a first control circuit 271b. The first delay circuit 271a delays the first control signal (PC) in response to the first bias voltage and the second bias voltage (VPBIAS, VNBIAS). The first control circuit 271b pulls down the pull-up signal (PG) via transistors N1 and N2 in response to the first control signal (PC) and the second bias voltage (VNBIAS), in the first stage. In the second stage, the first control circuit 271b pulls down the pull-up signal (PG) via transistors N3 and N4 in response to the first control signal (PC) and the output signal of first delay circuit 271a.

The second slew rate control circuit 272 includes a second delay circuit 272a and a second control circuit 272b. The second delay circuit 272a delays the second control signal (NC) in response to the first bias voltage and the second bias voltage (VPBIAS, VNBIAS). The second control circuit 272b pulls up the pull-down signal (NG) in response to the second control signal (NC) and the first bias voltage (VPBIAS), in the first stage. In the second stage, the second control circuit 272b pulls up the pull-down signal (NG) in response to the second control signal (NC) and the output signal of the second delay circuit 272a.

The first slew rate control circuit 271 is configured in such a manner that it pulls down the pull-up signal (PG) in two stages. However, it can be structured in such a manner that it pulls down the pull-up signal in three or more stages if desired. Similarly, the second slew rate control circuit 272 is configured to pull up the pull-down signal (NG) in two stages. However, if necessary, the second slew rate control circuit 272 can be structured in such a way that it can pull up the pull-down signal in three or more stages. Multiple stages are preferred for reducing the change in slew rate irrespective of a change in load at the output.

The unit delays d1 through d4 within the first delay circuit 271a and the unit delays d5 through d8 within the second delay circuit 272a are configured, for example, in the same manner as the unit delays 31 and 32 within the voltage controlled oscillator 24 shown in FIG. 3. That is, the respective sizes of the transistors within the unit delays d1 through d4 and the unit delays d5 and d8 are preferably the same as those of the unit delays 31 and 32.

The output driver 28 includes a PMOS pull-up driver P6 and an NMOS pull-down driver (N6). The PMOS pull-up driver P6 pulls up the output terminal 29 in response to the pull-up signal (PG) that is pulled down by the first slew rate control circuit 271 in multiple stages. The NMOS pull-down driver N6 pulls down the output terminal 29 in response to the pull-down signal (NG) that is pulled up by the second slew rate control circuit 272 in multiple stages.

Figure 5A:
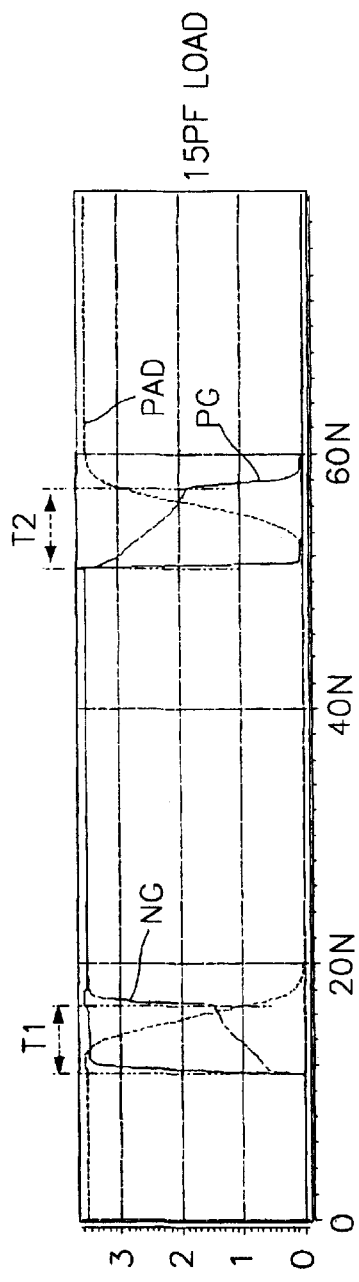
FIGS. 5A through 5C show simulation results of the output buffer circuit of FIG. 4 according to the present invention shown in FIG. 4.
Figure 5B:
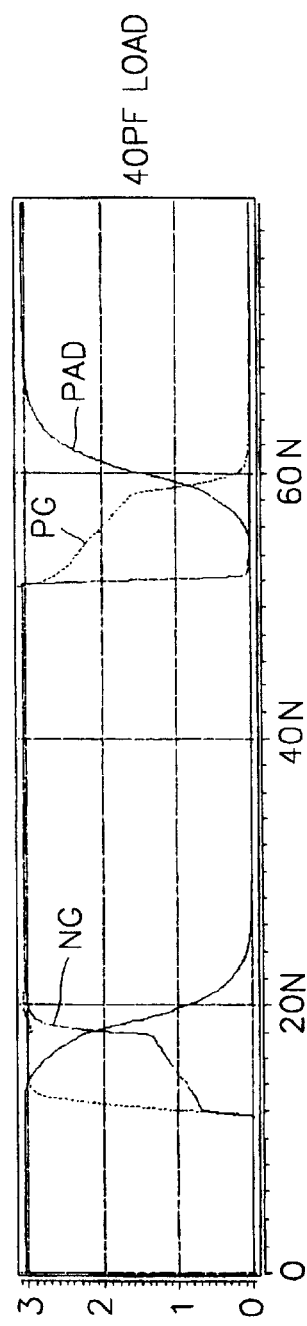
Figure 5C:
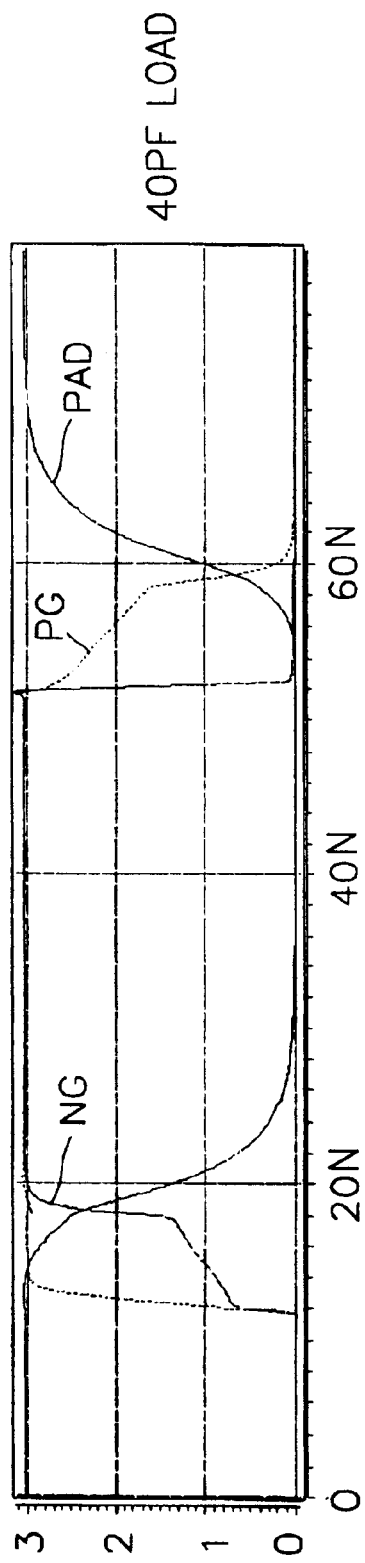

FIGS. 5A through 5C demonstrate simulation results of the output buffer circuit according to the present invention shown in FIG. 4. FIG. 5A illustrates the behavior of the output buffer when the load capacitance of the output terminal 29 is 15 pF; FIG. 5B illustrates the load capacitance at 27 pF; and FIG. 5C illustrates the load capacitance at 40 pF.

The operation of the output buffer circuit according to the present invention will now be described in detail with reference to FIGS. 4 and 5. If the logic levels of the first control signal (PC) and the second control signal (NC) are "Low", the PMOS transistor (P1) of the first control circuit 271b is turned on and the logic level of the pull-up signal (PG) becomes "High". The PMOS pull-up driver P6 is thus turned off.

In addition, since the logic level of the first bias voltage (VPBIAS) is "Low", the PMOS transistors P2, P3 and P5 of the second control circuit 272b are turned on and the voltage of the pull-down signal (NG) rises. After a pre-defined time, that is, the delay time T1 of the second delay circuit 272a, the PMOS transistor P4 of the second control circuit 272b is turned on and the voltage of the pull-down signal (NG) rises again. If the transistor P4 of the PMOS transistor is relatively large, the pull-down signal (NG) rises sharply after time T1, as shown in FIG. 5. The NMOS pull-down driver N6 is turned on in response to the pull-down signal (NG) that rises in two stages and pulls down the output terminal (PAD) 29.

When the logic levels of the first control signal (PC) and the second control signal (NC) are "high", the NMOS transistor N5 of the second control circuit 272b is turned on and the logic level of the voltage of the pull-down signal (NG) becomes "Low". Then, the NMOS pull-down driver N6 is turned off.

In addition, because the logic level of the second bias voltage (VNBIAS) is "High", the NMOS transistors N1, N2 and N3 of the first control circuit 271b are turned on and the voltage of the pull-up signal (PG) is pulled down. After a pre-defined time, that is, the delay time T2 of the first delay circuit 271a, the NMOS transistor N4 of the first control circuit 271b is turned on and the voltage of the pull-up signal is pulled down again. If the NMOS transistor N4 is big, the pull-up signal (PG) falls sharply after T2, as shown in FIG. 5. The PMOS pull-up driver P6 is turned on in response to the pull-up signal (PG) that is pulled down in two stages and pulls up the output terminal (PAD) 29.

Therefore, if the load capacitance of the output terminal 29 is relatively small, the output terminal 29 is operated using a relatively small current during the first falling section of the pull-up signal (PG) and the first rising section of the pull-down signal (NG). If the load capacitance of the output terminal 29 is relatively large, the output terminal 29 is operated by a large current during the second falling section of the pull-up signal (PG) and the second rising section of the pull-down signal (NG). Therefore, the resulting slew rate change is small even when the load capacitance of the output terminal 29 changes drastically.

While this invention has been particularly shown and described with reference to preferred embodiments thereof, it will be understood by those skilled in the art that various changes in form and details may be made therein without departing from the spirit and scope of the invention as defined by the appended claims.

As described above, the output buffer circuit according to the present invention is controlled by the bias voltages generated by the PLL, which are used to compensate for change in PVT. Therefore, in the output buffer circuit according to the present invention, the slew rate change is relatively small, even when PVT changes drastically. In addition, in the output buffer circuit according to the present invention, the pull-up signal that controls the PMOS pull-up driver is pulled down in multiple stages and the pull-down signal that controls the NMOS pull-down driver is pulled up in multiple stages. Therefore, in the output buffer circuit according to the present invention, the slew rate change is small even when the load capacitance of the output terminal changes drastically.

What is claimed is:

1. An output buffer circuit for a semiconductor device comprising:
   a pull-up driver for pulling up an output terminal in response to a pull-up signal;
   a pull-down driver for pulling down the output terminal in response to a pull-down signal;
   a first slew rate control circuit for controlling the voltage of the pull-up signal in multiple stages in response to a first control signal; and
   a second slew rate control circuit for controlling the voltage of the pull-down signal in multiple stages in response to a second control signal;
   wherein the first control signal and the second control signal are delayed in response to an output of a PLL (phase locked loop).

2. The output buffer circuit in the semiconductor device of claim 1, wherein the first slew rate control circuit comprises:
   a first delay circuit for delaying the first control signal in response to a first bias voltage and a second bias voltage; and a first control circuit for controlling the pull-up signal in response to the first control signal and the second bias voltage in a first stage of the multiple stages, and again controlling the pull-up signal in response to the first control signal and the output signal of the first delay circuit in a second stage of the multiple stages.

3. The output buffer circuit in the semiconductor device of claim 2, wherein the second slew rate control circuit comprises:
 a second delay circuit for delaying the second control signal in response to the first bias voltage and the second bias voltage; and
 a second control circuit for controlling the pull-down signal in response to the second control signal and the first bias voltage in a first stage of the multiple stages, and again controlling the pull-down signal in response to the second control signal and the output signal of the second delay circuit in a second stage of the multiple stages.

4. The output buffer circuit in the semiconductor device of claim 3, wherein the first bias voltage and the second bias voltage are the output provided by the PLL.

5. The output buffer circuit in the semiconductor device of claim 4, wherein the first delay circuit and the second delay circuit comprise unit delays substantially similar to corresponding unit delays of a voltage controlled oscillator of the PLL circuit.

6. A semiconductor device comprising:
 a PLL circuit including a voltage controlled oscillator that outputs a first bias voltage and a second bias voltage;
 a slew rate control circuit controlled by the first bias voltage and the second bias voltage, for controlling the voltage of a pull-up signal in multiple stages in response to a first control signal and controlling the voltage of a pull-down signal in multiple stages in response to a second control signal; and
 an output driver for pulling up the output terminal in response to the pull-up signal and pulling down the output terminal in response to the pull-down signal.

7. The semiconductor device of claim 6, wherein the slew rate control circuit comprises:
 a first slew rate control circuit controlled by the first bias voltage and the second bias voltage, for controlling the voltage of the pull-up signal in multiple stages in response to the first control signal; and
 a second slew rate control circuit controlled by the first bias voltage and the second bias voltage, for controlling the voltage of the pull-down signal in multiple stages in response to the second control signal.

8. The semiconductor device of claim 7, wherein the first slew rate control circuit comprises:
 a first delay circuit for delaying the first control signal in response to the first bias voltage and the second bias voltage; and
 a first control circuit for controlling the pull-up signal in response to the first control signal and the second bias voltage in a first stage of the multiple stages, and again controlling the pull-up signal in response to the first control signal and the output signal of the first delay circuit in a second stage of the multiple stages.

9. The semiconductor device of claim 8, wherein the second slew rate control circuit comprises:
 a second delay circuit for delaying the second control signal in response to the first bias voltage and the second bias voltage; and
 a second control circuit for controlling the pull-down signal in response to the second control signal and the first bias voltage in a first stage of the multiple stages, and again controlling the pull-down signal in response to the second control signal and the output signal of the second delay circuit in a second stage of the multiple stages.

10. The semiconductor device of claim 9, wherein the first delay circuit and the second delay circuit comprise unit delays substantially similar to corresponding unit delays within the voltage controlled oscillator of the PLL circuit.

11. An output buffer circuit for a semiconductor device comprising: a pull-up driver for pulling up an output terminal in response to a pull-up signal;
 a pull-down driver for pulling down the output terminal in response to a pull-down signal;
 a first slew rate control circuit for controlling the voltage of the pull-up signal in multiple stages in response to a first control signal, the first slew rate control circuit comprising:
  a first delay circuit for delaying the first control signal in response to a first bias voltage and a second bias voltage; and
  a first control circuit for controlling the pull-up signal in response to the first control signal and the second bias voltage in a first stage of the multiple stages, and again controlling the pull-up signal in response to the first control signal and the output signal of the first delay circuit in a second stage of the multiple stages; and
 a second slew rate control circuit for pulling up the voltage of the pull-down signal in multiple stages in response to a second control signal.

12. The output buffer circuit in the semiconductor device of claim 11, wherein the second slew rate control circuit comprises:
 a second delay circuit for delaying the second control signal in response to the first bias voltage and the second bias voltage; and
 a second control circuit for controlling the pull-down signal in response to the second control signal and the first bias voltage in a first stage of the multiple stages, and again controlling the pull-down signal in response to the second control signal and the output signal of the second delay circuit in a second stage of the multiple stages.

13. The output buffer circuit in the semiconductor device of claim 12, wherein the first bias voltage and the second bias voltage are provided by a PLL (phase locked loop).

14. The output buffer circuit in the semiconductor device of claim 13, wherein the first delay circuit and the second delay circuit comprise unit delays substantially similar to corresponding unit delays of a voltage controlled oscillator of the PLL circuit.

* * * * *